(12) United States Patent
Gotoh

(10) Patent No.: US 6,392,174 B1
(45) Date of Patent: May 21, 2002

(54) PRINTED CIRCUIT BOARD WITH FIXED CONTACTS OF SWITCH FORMED THEREON AND SWITCH USING SAME

(75) Inventor: Kazunori Gotoh, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/573,018

(22) Filed: May 17, 2000

(30) Foreign Application Priority Data

May 17, 1999 (JP) .......................................... 11-135960

(51) Int. Cl.⁷ ................................................ H01H 9/00
(52) U.S. Cl. ........................ 200/291; 174/261; 439/876
(58) Field of Search ............................ 200/502, 43.19, 200/512, 293, 303, 292; 174/261, 262; 439/876, 83, 291, 43.19

(56) References Cited

U.S. PATENT DOCUMENTS 4,554,829 A * 11/1985 Sumal ........................ 73/204
4,605,471 A * 8/1986 Mitchell ..................... 156/645
5,031,308 A * 7/1991 Yamashita et al. ............ 29/830
5,651,899 A * 7/1997 Schmidt et al. ............. 216/18
5,802,911 A * 9/1998 Cahill et al. ................ 73/727

* cited by examiner

*Primary Examiner*—P. Austin Bradley
*Assistant Examiner*—Lisa N. Klaus
(74) *Attorney, Agent, or Firm*—Brinks Hofer Gilson & Lione

(57) ABSTRACT

It is an object of the present invention to provide a printed circuit board with no likelihood of scattering of a powdery material from inner walls of mounting holes formed in the printed circuit board at the time of inserting boss portions of a mounting member into the mounting holes, the mounting member being for mounting the printed circuit board or to be mounted to the same board, as well as a switch using the printed circuit board. In the printed circuit board according to the present invention, an insulating board portion is provided with circuit patterns and mounting holes, which mounting holes are subjected to a through-hole plating to formed electrically conductive layers respectively therein, and then boss portions of a mounting member are inserted into the thus-plated through holes.

6 Claims, 3 Drawing Sheets

PRINTED CIRCUIT BOARD WITH FIXED CONTACTS OF SWITCH FORMED THEREON AND SWITCH USING SAME

BACKGROUND OF THE INVENTION

1. Field of the Invention

The present invention relates to a printed circuit board and a switch using the same. Particularly, the invention is concerned with a printed circuit board with fixed contacts of a switch formed thereof, as well as a switch using the same.

2. Description of the Related Art

A conventional printed circuit board and a switch using the same will be described below with reference to drawings.

FIG. 3 is an exploded perspective view for explaining a conventional printed circuit board and a switch using the same. This conventional switch is disposed integrally with a vehicular steering wheel for example and is used for setting a cruising speed in vehicular auto-cruising, for switching over from one such cruising speed to another, and for radio channel selection. FIG. 4 is a sectional view of a principal portion for explaining the switch shown in FIG. 3.

In FIGS. 3 and 4, a mounting member 1 is formed by molding an insulating molding material such as, for example, a glass-filled epoxy resin. The mounting member 1 has a flat plate-like support member 1a and a plurality (for example, three) of cylindrical boss portions 1b projecting outward (upward) at predetermined positions of the support member 1a.

The boss portions 1b of the mounting member 1 are each composed of a large-diameter portion 1c and a small-diameter portion 1d, with a stepped portion being formed by the large- and small-diameter portions 1c, 1d. The boss portions 1b constitute mounting means.

A printed circuit board 2 is formed by molding an insulating molding material such as, for example, a glass-filled epoxy resin or phenolic resin and it has a flat plate-like board portion 2a, circuit patterns 2b formed in a predetermined shape on at least one side of the board portion 2a and having a predetermined electrical function, and a plurality (for example, 3+2=5) of circular mounting holes 2c and 2g formed in the board portion 2a at positions where the circuit patterns 2b are not formed.

In an inner walls 2d and 2h of the mounting holes 2c and 2g, the board portion 2a is arranged so as to exposed. For example, the mounting holes 2c and 2g are formed by blanking with use of a press.

A pair of oppositely disposed fixed patterns 2e of a switch 10 which will be described later are connected to each of the circuit patterns 2b, which patterns have a predetermined electrical function.

An elastic member 3 is formed in a generally flat plate shape by molding a transparent or translucent elastic material such as rubber and it is provided with a base portion 3a, a plurality (for example, three) of generally cylindrical retaining portions 3b for retaining upper end portions of the boss portions 1b of the mounting member 1, and boss portions 3g which are inserted through the mounting holes 2g formed in the printed circuit board 2 to mount the elastic member 3 to the printed circuit board 2. The retaining portions 3b and the boss portions 3g are formed in an outwardly projecting state from the base portion 3a.

Movable contact portions 4, which are integral with the elastic member 3, are each formed in a generally dome shape by molding and are each provided with a generally cylindrical pressing portion 4a and a movable contact 4b (see FIG. 4) provided on the underside of the pressing portion 4a. The elastic member 3 integral with the movable contact portions 4 is disposed on the printed circuit board 2 by a suitable means so that the paired fixed contacts 2e of the printed circuit board 2 are opposed to the movable contact 4b in each movable contact portion 4. The switch 10 is formed by moving the movable contact 4b into contact with and away from the fixed contacts 2e (making ON and OFF).

The following description is now provided about a mounting process for mounting the printed circuit board and the elastic member to the mounting member.

According to this mounting process, first the mounting member 1 and the printed circuit board 2 are disposed so that the small-diameter portions 1d of the boss portions 1b on the mounting member are inserted respectively through the mounting holes 2c formed in the printed circuit board 2. As a result, the printed circuit board 2 is brought into engagement with the mounting member 1 and is positioned relative to the mounting member. Thus, the printed circuit board is made integral with the mounting member. The insertion of the small-diameter portions 1d into the mounting holes 2c is effected in a slightly tight fitting condition.

Next, in the state in which the mounting member 1 and the printed circuit board 2 are thus rendered integral with each other, the elastic member 3 is put on the printed circuit board so that the boss portions 3g of the elastic member 3 are inserted respectively through the mounting holes 2g formed in the printed circuit board and so that the small-diameter portions 1d of the mounting member 1 are respectively fitted in the retaining portions 3b of the elastic member. As a result, the paired fixed contacts 2e on the printed circuit board 2 are opposed to the movable contact 4b of each movable contact 4. In this way the mounting member 1, the printed circuit board 2 and the elastic member 3 are rendered integral with one another.

In the conventional printed circuit board 2 described above, the board portion 2a (cut-out surfaces of the printed circuit board) are exposed as they are to the mounting holes 2c formed by blanking with a press in the printed circuit board, so if the small-diameter portions 1d of the mounting member 1 are inserted into the mounting holes 2c in a slightly tight fitting condition, a powdery material 5 (see FIG. 4) formed by the blanking from the board portion 2a is scattered to one side of the printed circuit board 2. The powdery material 5 thus scattered drops onto the fixed contacts 2e (circuit patterns 2b) on the printed circuit board 2, thus giving rise to the problem that the contact between the fixed contacts 2e and the movable contact 4b both constituting a switch becomes unstable.

The problem of the powdery material 5 arises also in case of inserting the boss portions 3g of the elastic member 3 in a slightly tight fitting condition into the mounting holes 2g formed in the printed circuit board 2.

SUMMARY OF THE INVENTION

The present invention has been accomplished for solving the above-mentioned problem and it is an object of the invention to provide a printed circuit board 2 free from a fear of scattering of a powdery material from the mounting holes 2c or 2g, as well as a switch using such a printed circuit board.

In the printed circuit board according to the present invention, circuit patterns are formed on a board portion which is formed of an insulating-material, and mounting holes are formed in the board portion, the mounting holes being subjected to a through-hole plating method to form electrically conductive through-hole-plated plating layers respectively therein, further, boss portions of a mounting member formed of an insulating material are inserted respectively into the mounting holes to mount the printed circuit board to the mounting member.

In the printed circuit board according to the present invention, the electrically conductive plating layers formed respectively in the mounting holes are independent of the circuit patterns.

In the printed circuit board according to the present invention, the circuit patterns have fixed contacts of a switch.

The switch using a printed circuit board according to the present invention has the printed circuit board, a mounting member formed with boss portions, and a movable contact disposed in an opposed relation to fixed contacts, the boss portions of the mounting member being inserted respectively into mounting holes formed in the printed circuit board to mount the printed circuit board to the mounting member.

The switch using a printed circuit board according to the present invention has the printed circuit board, the printed circuit board being formed of an insulating material and provided with circuit patterns including fixed contacts of a switch and also provided with mounting through holes, and an elastic member having a movable contact disposed in an opposed relation to the fixed contacts and also having boss portions, the mounting holes formed in the printed circuit board being subjected to a through-hole plating method to form electrically conductive through-hole-plated plating layers respectively therein, the boss portions of the elastic member being inserted into the mounting holes in the printed circuit board to mount the elastic member to the printed circuit board.

In the switch according to the invention, the electrically conductive plating layers formed respectively in the mounting holes are independent of the circuit patterns.

DETAILED DESCRIPTION OF A PREFERRED EMBODIMENT

A switch using a printed circuit board according to an embodiment of the present invention will be described hereinunder with reference to the accompanying drawings.

Figure 1:
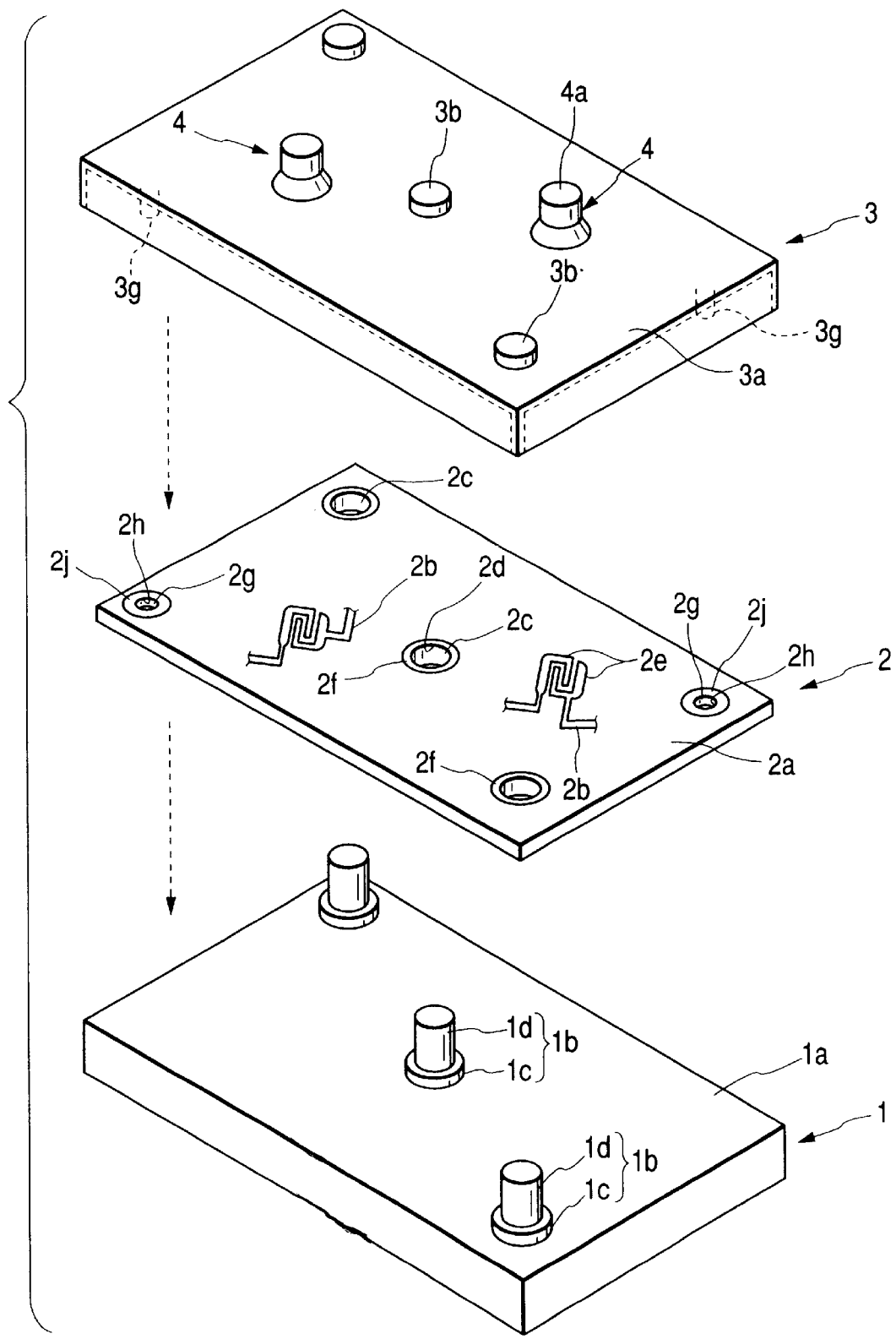
FIG. 1 is an exploded perspective view of a switch using a printed circuit board according to an embodiment of the present invention.
Figure 2:
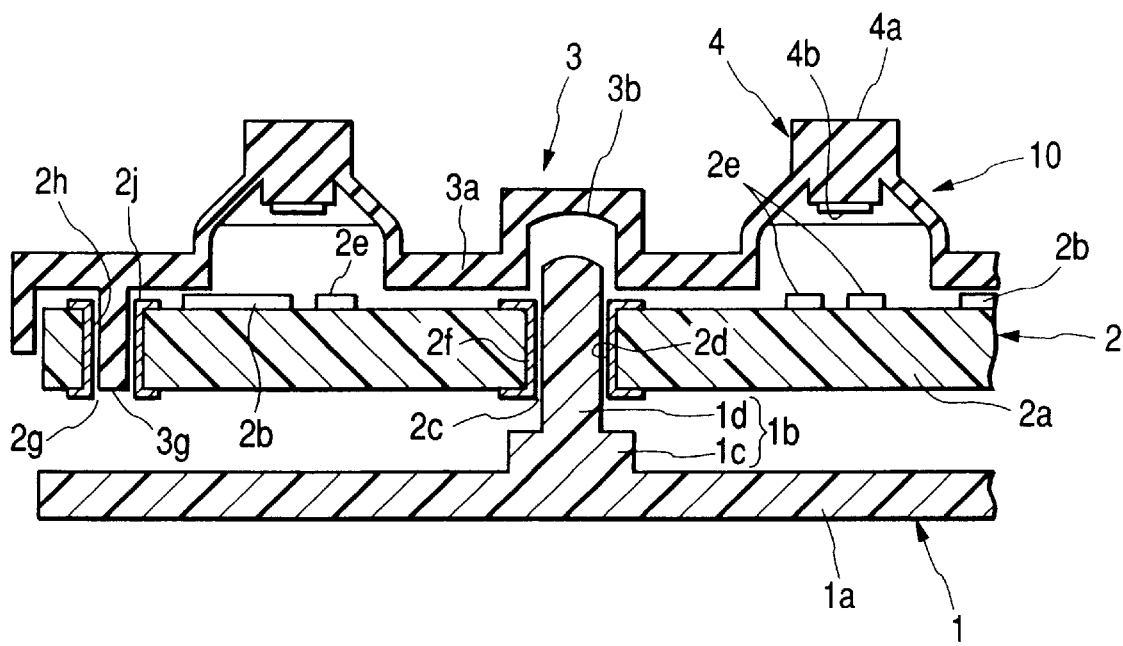
FIG. 2 is a sectional view of a principal portion of the switch shown in FIG. 1.
Figure 4:
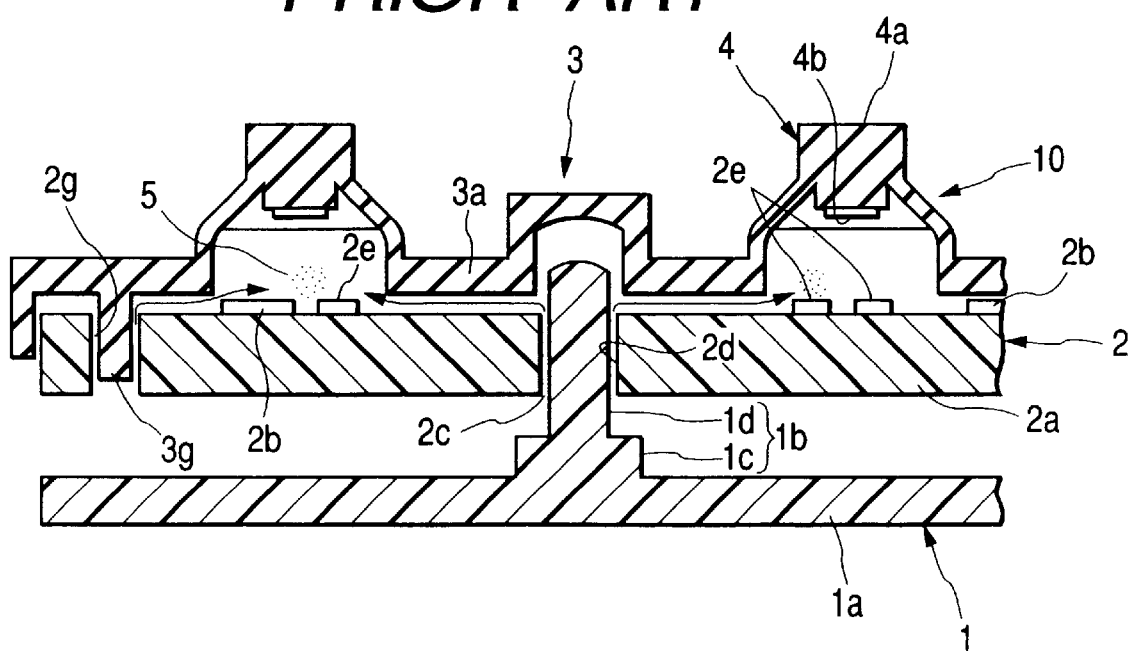
FIG. 4 is a sectional view of a principal portion of the switch shown in FIG. 3.
Figure 3:
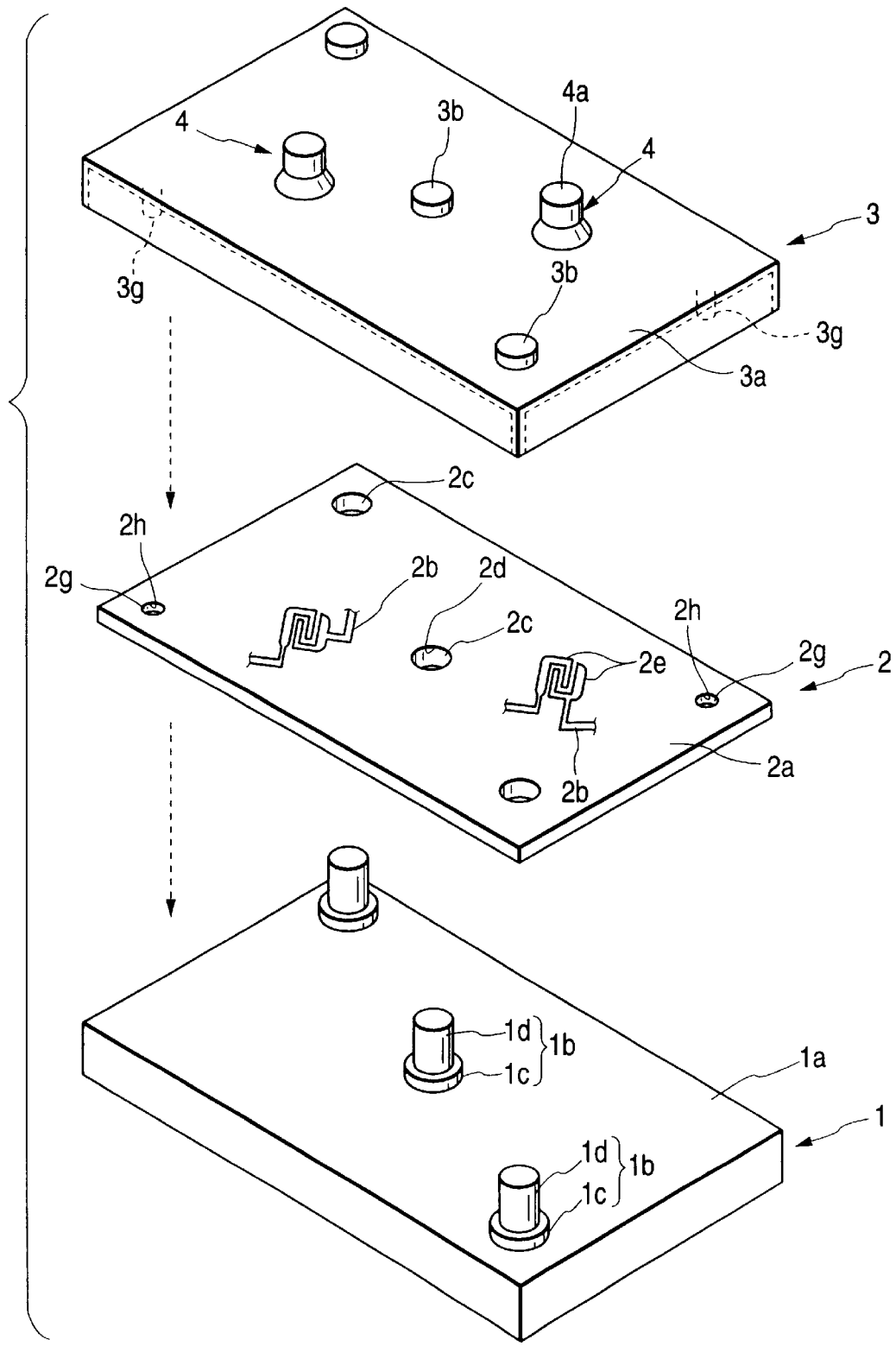
FIG. 3 is an exploded perspective view of a conventional switch using a printed circuit board.

FIG. 1 is an exploded perspective view of the switch. For example, this switch is disposed integrally with a vehicular steering wheel and is used for setting a cruising speed in vehicular auto-cruising, for switching over from one such cruising speed to another, and for radio channel selection. FIG. 2 is a sectional view of a principal portion for explaining the switch of FIG. 1. In these figures, the same components as in the foregoing conventional switch are indicated by the same reference numerals as in the conventional switch.

As shown in FIGS. 1 and 2, a mounting member 1 is formed by molding an insulating molding material such as a glass-filled epoxy resin and it has a flat plate-like support member 1a and a plurality (for example, three) of cylindrical boss portions 1b projecting outward (upward) from the support member 1a at predetermined positions.

The boss portions 1b of the mounting member 1 are each composed of a large-diameter portion 1c and a small-diameter portion 1d, with a stepped portion being formed by the large- and small-diameter portions 1c, 1d. The boss portions 1b constitute mounting means.

A printed circuit board 2 is formed by molding an insulating molding material such as, for example, a glass-filled epoxy resin or phenolic resin and it has a flat plate-like board portion 2a, circuit patterns 2b formed in a predetermined shape on at least one side of the board portion 2a and having a predetermined electrical function, and a plurality (for example, 3+2=5) of cylindrical mounting holes 2c and 2g formed in the board portion 2a at positions where the circuit patterns 2b are not formed.

On inner walls 2d and 2h of the mounting holes 2c and 2g respectively are formed electrically conductive through-hole-plated plating layers 2f and 2j respectively by a through-hole plating method. Thus, exposed sectional portions of the board portion 2a are covered with the electrically conductive plating layers 2f and 2j. More specifically, the mounting holes 2c and 2g are formed by blanking with a press for example and subsequently their inner walls 2d and 2h are subjected to a through-hole plating method together with, for example, terminal holes for electric components' terminals formed in an integrated circuit (IC) to form the electrically conductive plating layers 2f and 2j.

A pair of opposed, fixed contacts 2e of a switch 10 which will be described later are connected to each of the circuit patterns 2b, which patterns have a predetermined electrical function.

An elastic member 3 is formed in a generally flat plate shape by molding a transparent or translucent elastic material such as rubber for example and it is provided with a base portion 3a, a plurality (for example, three) of generally cylindrical retaining portions 3b for retaining upper end portions of the boss portions 1b of the mounting member 1, and boss portions 3g to be inserted into the mounting holes 2g formed in the printed circuit board 2 to mount the elastic member 3 to the same board. The retaining portions 3b and the boss portions 3g are formed in an outwardly projecting state from the base portion 3a.

Movable contact portions 4 are formed by molding in a generally dome shape integrally with the elastic member 3 and are each provided with a generally cylindrical pressing portion 4a and a movable contact 4b (see FIG. 2) formed on the underside of the pressing portion 4a. The elastic member 3 integral with the movable contact portion 4 is disposed on the printed circuit board 2 by a suitable means so that the paired fixed contacts 2e on the printed circuit board 2 are opposed to the movable contact 4b of each movable contact portion 4. By moving the movable contact 4b into contact with and away from the fixed contacts 2e (making ON and OFF) there is constituted the switch 10.

A description will now be given of a mounting process for mounting the printed circuit board and the elastic member to the mounting member.

First, the mounting member 1 and the printed circuit board 2 are disposed in such a manner that the small-diameter portions 1d in the boss portions 1b of the mounting member are inserted respectively into the mounting holes 2c formed in the printed circuit board. As a result, the printed circuit board 2 is engaged with the mounting member 1 and is positioned relative to the mounting member. In this way both are rendered integral with each other. The insertion of the small-diameter portions 1d into the mounting holes 2c is effected in a slightly tight fitting condition.

Next, in the state in which the mounting member 1 and the printed circuit board 2 are thus rendered integral with each other, the elastic member 3 is disposed on the printed circuit board so that the boss portions 3g of the elastic member 3 are inserted into the mounting holes 2g formed in the printed circuit board and so that the small-diameter portions 1d of the mounting member 1 are respectively fitted in the retaining portions 3b of the elastic member. As a result, the paired fixed contacts on the printed circuit board 2 are opposed to the movable contact 4b of each movable contact portion 4. In this way the mounting member 1, the printed circuit board 2 and the elastic member 3 are rendered integral with one another.

Although in the above embodiment electrically conductive plating layers are formed respectively in the mounting holes of the printed circuit board, the present invention is not limited thereto. Electrically conductive through-hole-plated layers may be formed by a through-hole plating method respectively in insertion holes formed in the printed circuit board into which are inserted body portion, exclusive of terminal portions, of electric components such as coil components, integrated circuit components, and electrolytic capacitor components to prevent scattering of a powdery material from the substrate portion of the printed circuit board at the time of inserting body portions of electric components into the insertion holes.

Although in the above embodiment electrically conductive plating layers are formed in both the mounting holes for mounting the mounting member and the mounting holes for mounting the elastic member, it goes without saying that the layers may be formed in only one mounting holes.

In this case, the terminal portions of the electric components are not connected to the electrically conductive plating layers but are connected to the circuit patterns. The insertion of the electric components' body portions into the insertion holes is performed for reducing the thickness of the printed circuit board with the electric components disposed thereon and for enhancing the heat radiating effect of the electric components.

Although in the above embodiment the mounting holes formed in the printed circuit board are circular holes, no limitation is made thereto. For example, the mounting holes may be rectangular, polygonal, or oval. A suitable shape is selected in relation to the shape of the boss portions (mounting means). Further, although in the above embodiment the electrically conductive plating layers formed in the printed circuit board are independent of the circuit patterns, no limitation is made thereto. The electrically conductive layers and the circuit patterns may be connected with each other.

As set forth above, in the printed circuit board according to the present invention, since electrically conductive through-hole-plated plating layers are formed respectively in the mounting holes of the printed circuit board by a through-hole plating method, even when the boss portions (mounting means) of the mounting member are inserted into the mounting holes, there is no fear that a powdery material produced from the board portion of the printed circuit board may scatter from the mounting holes which are coated with the electrically conductive plating layers. Thus, it is possible to provide a printed circuit board which can retain a stable electrical performance (function) without adverse effect on the electrical performance of the same board.

In the printed circuit board according to the present invention, moreover, since the electrically conductive plating layers and the circuit patterns are independent of each other and not interconnected, even if the electrically conductive plating layers are cut (broken) by the boss portions of the mounting member at the time of inserting the boss portions respectively into the mounting holes with the plating layers formed therein, such breakage of the plating layers will not exert any influence on the electrical conduction. Thus, the printed circuit board can retain a stable electrical performance.

Further, in the switch according to the present invention, since electrically conductive through-hole-plated layers are formed respectively in the mounting holes of the printed circuit board by a through-hole plating method, a powdery material does not scatter even when the boss portions of the mounting member are inserted into the mounting holes and therefore no influence is exerted on the switch performance.

Further, in the switch according to the present invention, since electrically conductive layers are formed respectively in the mounting holes of the printed circuit board by a through-hole plating, a powdery material does not scatter even when the boss portions of the mounting member are inserted into the mounting holes and therefore no influence is exerted on the switch performance.

Additionally, in the switch according to the present invention, even when the boss portions of the elastic member provided with movable contacts are fitted in the mounting holes of the printed circuit board, there is no fear of adverse effect being exerted on the switch performance because a powdery material does not scatter.

What is claimed is:

1. A printed circuit board comprising a board portion formed of an insulating material, the board portion having circuit patterns and mounting through holes, with electrically conductive through-hole-plated layers being formed respectively in the mounting holes, and wherein boss portions of a mounting member formed of an insulating material are inserted respectively into the mounting holes to mount the printed circuit board to the mounting member, the conductive layers covering inner walls of the mounting holes to prevent dispersion of powder when the boss portions of the mounting member are inserted into and passed through the mounting holes.

2. A printed circuit board according to claim 1, wherein the electrically conductive layers are independent of the circuit patterns.

3. A printed circuit board according to claim 1, wherein the circuit patterns have fixed contacts of a switch.

4. A switch comprising:

a printed circuit board comprising a board portion formed of an insulating material, the board portion having circuit patterns, fixed contacts of a switch, and mounting through holes, with electrically conductive through-hole-plated plating layers being formed respectively in the mounting holes;

a movable contact disposed in an opposed relation to the fixed contacts; and a mounting member having boss portions, the boss portions of the mounting member being inserted respectively into the mounting holes to mount the printed circuit board to the mounting member, the conductive plating layers covering inner walls of the mounting holes to prevent dispersion of powder when the boss portions of the mounting member are inserted into and passed through the mounting holes.

5. A switch comprising:

a printed circuit board formed of an insulating material, the printed circuit board having circuit patterns and mounting through holes, the circuit patterns including fixed contacts of a switch; and an elastic member having a movable contact and boss portions, the movable contact being disposed in an opposed relation to the fixed contacts, wherein electrically conductive through-hole-plated plating layers are formed respectively in the mounting holes, and the boss portions of the elastic member are inserted into the mounting holes to mount the elastic member to the printed circuit board, the conductive plating layers covering inner walls of the mounting holes to prevent dispersion of powder when the boss portions of the elastic member are inserted into and passed through the mounting holes.

6. A switch according to claim 5, wherein the electrically conductive layers are independent of the circuit patterns.

* * * * *